US009055691B2

(12) United States Patent
Doglio et al.

(10) Patent No.: US 9,055,691 B2
(45) Date of Patent: Jun. 9, 2015

(54) ASSEMBLY FOR SERVER RACK CHASSIS

(71) Applicants: Jean Doglio, Pflugerville, TX (US); Bernard D. Strmiska, Round Rock, TX (US); Randall T. Smith, Liberty Hill, TX (US); Steven J. Zielnicki, Round Rock, TX (US)

(72) Inventors: Jean Doglio, Pflugerville, TX (US); Bernard D. Strmiska, Round Rock, TX (US); Randall T. Smith, Liberty Hill, TX (US); Steven J. Zielnicki, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 132 days.

(21) Appl. No.: 13/624,400

(22) Filed: Sep. 21, 2012

(65) Prior Publication Data

US 2014/0084763 A1    Mar. 27, 2014

(51) Int. Cl.
| | |
|---|---|
| A47B 81/00 | (2006.01) |
| A47B 97/00 | (2006.01) |
| G06F 1/16 | (2006.01) |
| H05K 5/00 | (2006.01) |
| H05K 7/00 | (2006.01) |
| H05K 7/14 | (2006.01) |

(52) U.S. Cl.
CPC .................................. H05K 7/1489 (2013.01)

(58) Field of Classification Search
CPC .. G11B 33/128; G11B 33/126; H05K 7/1461; H05K 7/1489
USPC ........... 312/223.2; 361/802, 727, 756, 679.02
See application file for complete search history.

(56) References Cited

U.S. PATENT DOCUMENTS

| | | | | |
|---|---|---|---|---|
| 2,256,834 | A * | 9/1941 | Mandel | 229/125.39 |
| 3,708,618 | A * | 1/1973 | Hofmeister et al. | 348/839 |
| 4,759,466 | A * | 7/1988 | Chase et al. | 220/4.02 |
| 4,821,145 | A * | 4/1989 | Corfits et al. | 361/692 |
| 5,124,886 | A * | 6/1992 | Golobay | 361/727 |
| 5,381,315 | A * | 1/1995 | Hamaguchi et al. | 361/727 |
| 5,419,629 | A * | 5/1995 | Korinsky | 312/263 |
| 6,141,211 | A * | 10/2000 | Strickler et al. | 361/679.31 |
| 6,324,062 | B1 * | 11/2001 | Treiber et al. | 361/727 |
| 6,324,608 | B1 * | 11/2001 | Papa et al. | 710/104 |
| 6,442,035 | B1 * | 8/2002 | Perry et al. | 361/756 |
| 6,552,915 | B2 * | 4/2003 | Takahashi et al. | 361/796 |
| 6,580,616 | B2 * | 6/2003 | Greenside et al. | 361/752 |
| 6,654,241 | B2 * | 11/2003 | Hillyard et al. | 361/679.48 |
| 6,856,508 | B2 * | 2/2005 | Rabinovitz | 361/679.31 |
| 6,944,019 | B2 * | 9/2005 | King et al. | 361/679.02 |
| 7,167,368 | B2 * | 1/2007 | Ya | 361/707 |
| 7,298,624 | B2 * | 11/2007 | Boswell et al. | 361/727 |
| 7,499,286 | B2 * | 3/2009 | Berke et al. | 361/756 |
| 7,511,230 | B2 * | 3/2009 | Cochrane | 174/382 |
| 7,684,208 | B2 * | 3/2010 | Okamoto et al. | 361/798 |
| 7,889,508 | B2 * | 2/2011 | Sato et al. | 361/756 |
| 7,985,931 | B2 * | 7/2011 | Akama et al. | 174/363 |
| 7,995,355 | B2 * | 8/2011 | Cochrane | 361/818 |
| 8,039,763 | B1 * | 10/2011 | Cochrane | 174/377 |
| 8,054,632 | B2 * | 11/2011 | Regimbal et al. | 361/727 |

(Continued)

*Primary Examiner* — Daniel J Troy
*Assistant Examiner* — Kimberley S Wright
(74) *Attorney, Agent, or Firm* — Larson Newman, LLP

(57) ABSTRACT

An assembly includes an enclosure and a guide rail. The enclosure includes first and second top portions, first and second side portions, and a bottom portion, and is a single piece of material such that the first top portion, the first side portion, the bottom portion, the second side portion, and the second top portion are continuous portions of the single piece of material. The guide rail is attached to the first and second top portions of the enclosure, to join the first and second top portions together, and to align the assembly within a server rack chassis.

14 Claims, 3 Drawing Sheets

(56) References Cited

U.S. PATENT DOCUMENTS

| | | | |
|---|---|---|---|
| 8,054,645 B2* | 11/2011 | Ikeda et al. | 361/802 |
| 8,149,586 B2* | 4/2012 | Curnalia et al. | 361/786 |
| 8,355,263 B2* | 1/2013 | Myers et al. | 361/816 |
| 8,582,306 B2* | 11/2013 | Hamand et al. | 361/727 |
| 2002/0006026 A1* | 1/2002 | Takahashi et al. | 361/687 |
| 2003/0002253 A1 | 1/2003 | Hillyard et al. | |
| 2003/0161101 A1 | 8/2003 | Hillyard et al. | |
| 2006/0221575 A1* | 10/2006 | Ya | 361/707 |
| 2008/0180925 A1* | 7/2008 | McClure et al. | 361/756 |
| 2008/0239648 A1 | 10/2008 | Okamoto et al. | |
| 2008/0239689 A1 | 10/2008 | Okamoto et al. | |
| 2009/0231824 A1* | 9/2009 | Ikeda et al. | 361/802 |
| 2009/0284907 A1* | 11/2009 | Regimbal et al. | 361/679.02 |
| 2010/0026148 A1* | 2/2010 | Zhang et al. | 312/223.2 |
| 2010/0182754 A1* | 7/2010 | Curnalia et al. | 361/733 |
| 2011/0090628 A1* | 4/2011 | Sullivan | 361/679.02 |
| 2011/0115346 A1* | 5/2011 | Bielecki | 312/213 |
| 2011/0211327 A1* | 9/2011 | Myers et al. | 361/818 |
| 2014/0108692 A1* | 4/2014 | Doglio et al. | 710/300 |

* cited by examiner

ASSEMBLY FOR SERVER RACK CHASSIS

FIELD OF THE DISCLOSURE

This disclosure generally relates to information handling systems, and more particularly relates to an assembly for a server rack chassis.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A server rack chassis can hold servers, power supplies, hard drive bays, and the like. Each of the servers, power supplies, and hard drive bays can be enclosed with different types of material, such as sheet metal. The enclosures typically include multiple separate sheets of metal that overlap to create a desired exterior shape of the enclosure. The different sheets of metal can then be connected together at the overlapping locations to complete and close the enclosure.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
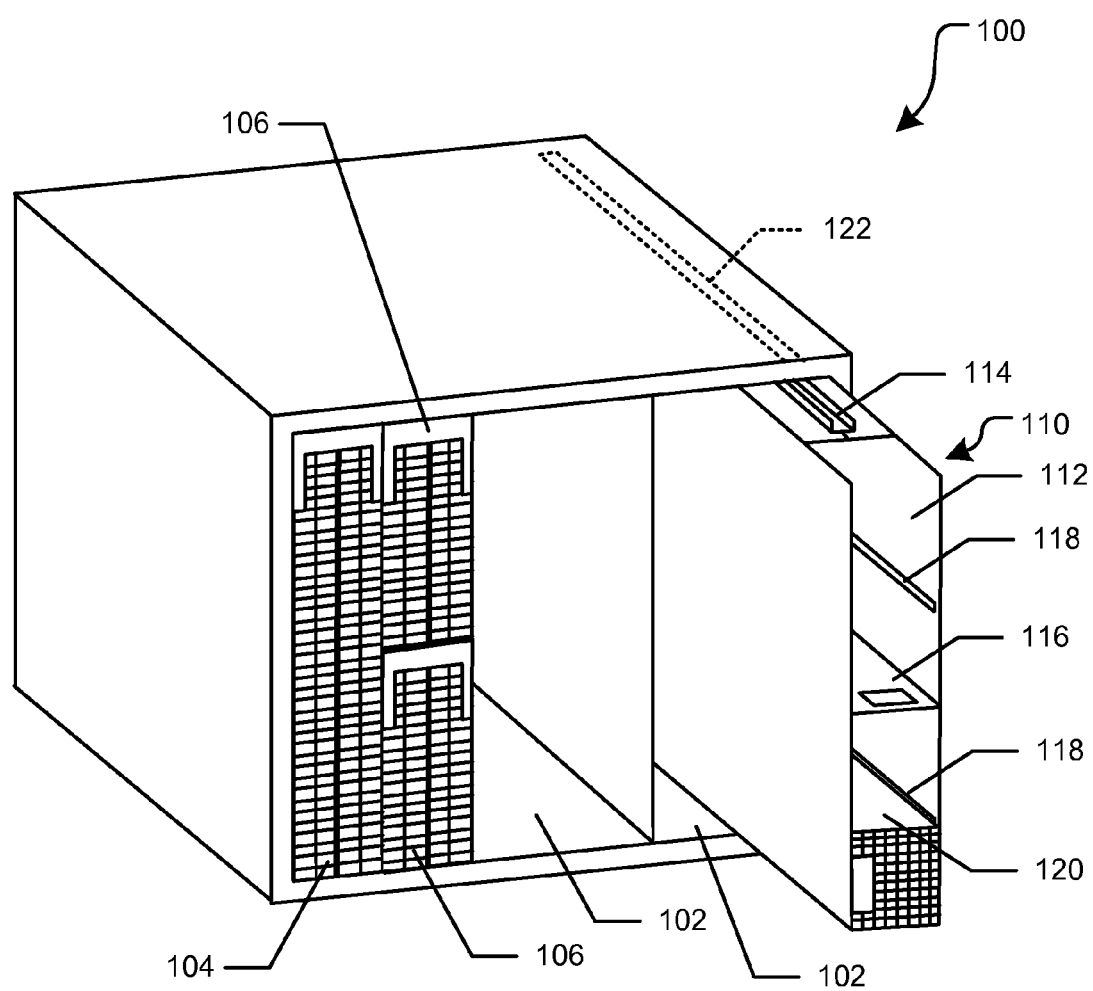
FIG. 1 is a perspective view of a server rack chassis.

FIG. 1 shows a perspective view of a server rack chassis 100 for an information handling system. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The server rack chassis 100 includes bays 102 for receiving servers 104 and 106, and an assembly 110. In an embodiment, the server rack chassis 100 can be a blade server rack, the servers 104 and 106 can be blade servers, and the assembly 110 can be a blade server adaptor to enable blade servers that could not otherwise fit well within the bay 102 to connect with the server rack chassis. The assembly 110 includes an enclosure 112, a guide rail 114, a plate 116, and rails 118. The plate 116 is mounted within the middle of enclosure 112 to provide structural support to the enclosure, and the rails 118 are mounted on the inside of the walls to provide alignment and support of servers 120 within the enclosure. The assembly 110 can be designed to receive multiple servers 120. In an embodiment, the server 104 can be a full height server, the servers 106 can be half height servers, and the server 120 can be a quarter height server. With respect to this disclosure, full height indicates that the server is about the height of the bay 102, half height indicates that the server is about half of the height of the bay, and quarter height indicates that the server is about a quarter of the height of the bay. While the embodiments are discussed with respect to a blade server chassis and blade servers, the assembly 110 can be used to provide alignment for any type of device within any type of chassis.

In an embodiment, each bay 102 of the server rack chassis 100 can receive multiple servers. For example, the bay 102 can receive two servers 104, one server 104 and two servers 106, or four servers 106. Additionally, the assembly can take up substantially the same amount of space in the bay 102 as the server 104, such that the bay can receive two adaptor assemblies 110. However because each bay 102 can vary in size, the number of servers 104 and 106, and the number of adaptor assemblies 110 that can fit within a single bay can also vary.

The guide rail 114 can align with a chassis rail 122 of the server rack chassis 100 to align the assembly 110 within the bay 102. The assembly 110 can then slide into the bay 102 at a desired orientation based upon the guide rail 114 sliding along the chassis rail 122. The assembly 110 can be locked into place within the bay 102 via a locking mechanism. After the assembly 110 is locked into place within the bay 102, one or more servers 120 can be inserted into the assembly and connected to a backplane of the server rack chassis 100.

Figure 2:
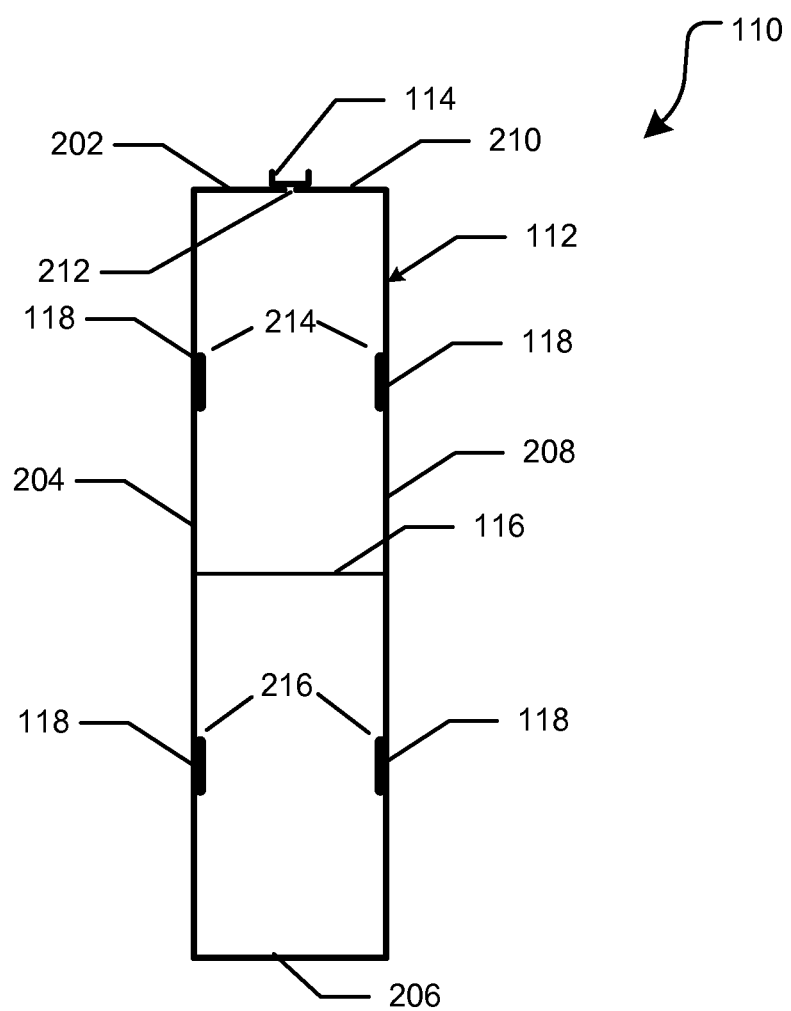
FIG. 2 is a front view of an assembly of the server rack chassis.

FIG. 2 shows a front view of the assembly 110 of the server rack chassis 100. The enclosure 112 of the assembly 110 includes a first top portion 202, a first side portion 204, a bottom portion 206, a second side portion 208, and a second top portion 210. The enclosure 112 is a single piece of material, such as metal, that is bent to form the portions 202-210 of the enclosure without any of the portions overlapping. In particular, the single piece of material is bent at an intersection of the first top portion 202 and the first side portion 204, an intersection of the first side portion and the bottom portion 206, an intersection of the bottom portion and the second side portion 208, and an intersection of the second side portion and the second top portion 210. The enclosure 112 is held together by the guide rail 114 attaching to the first top portion 202 and the second top portion 210. The guide rail 114 also covers a seam 212 created between the first top portion and the second top portion. The enclosure 112 can be designed without a front portion or a back portion so that the servers 120 can be inserted into the assembly 110 and connected to the server rack chassis 100. In another embodiment, the enclosure 112 can include a back portion having openings that enable the servers 120 to engage and connect with a backplane of the server rack chassis 100.

In an embodiment, the enclosure 112 can be long and narrow, which may increase the chance that the enclosure will buckle or bend when the servers 120 are inserted into the enclosure if the plate 116 is not mounted in the enclosure. The plate 116 may therefore be mounted between the first side portion 204 and the second side portion 208 to provide additional structural integrity to the enclosure when the servers 120 are inserted into the enclosure. The plate 116 can be mounted at a location that is about half way up the height of the first side portion 204 and the second side portion 208, such that an equal number of servers 120 can be inserted above and below the plate without having unused space in the enclosure.

The rails 118 can be mounted on the inside of the first side portion 204 and the inside of the second side portion 208. In an embodiment, two rails 118 can be mounted within the enclosure 112 above the plate 116, and two rails can be mounted below the plate. For example, the rails 118 can be mounted so that a first rail is mounted at a location above the plate 116 that is substantially the same height on the first side portion 204 as a second rail is mounted on the second side portion 208 to create a first rail pair 214. Similarly, a third rail is mounted below the plate 116 at a location that is substantially the same height on the first side portion 204 as a fourth rail is mounted on the second side portion 208 to create a second rail pair 216. Both of the rail pairs 214 and 216 can be used to align four individual servers 120 within the enclosure 112, and to provide support within the enclosure to the server inserted above the first rail pair and to the server inserted above the second rail pair.

The enclosure 112 can provide more room for the servers 120 as compared to an enclosure created from multiple pieces of material, because there is no overlap between any of the portions 202-210 whereas an enclosure with multiple pieces has an overlap where the pieces are connected together. Also, additional space is located between the assembly 110 and the server rack chassis 100 of FIG. 1 based on the thickness of the enclosure 112 being equal to only the thickness of a single sheet of the material that is used in forming the enclosure. This additional space provides space for a locking mechanism to securely hold the assembly 110 within the server rack chassis 110 without reducing an amount of space to fit four servers 120 within the enclosure 112.

Figure 3:
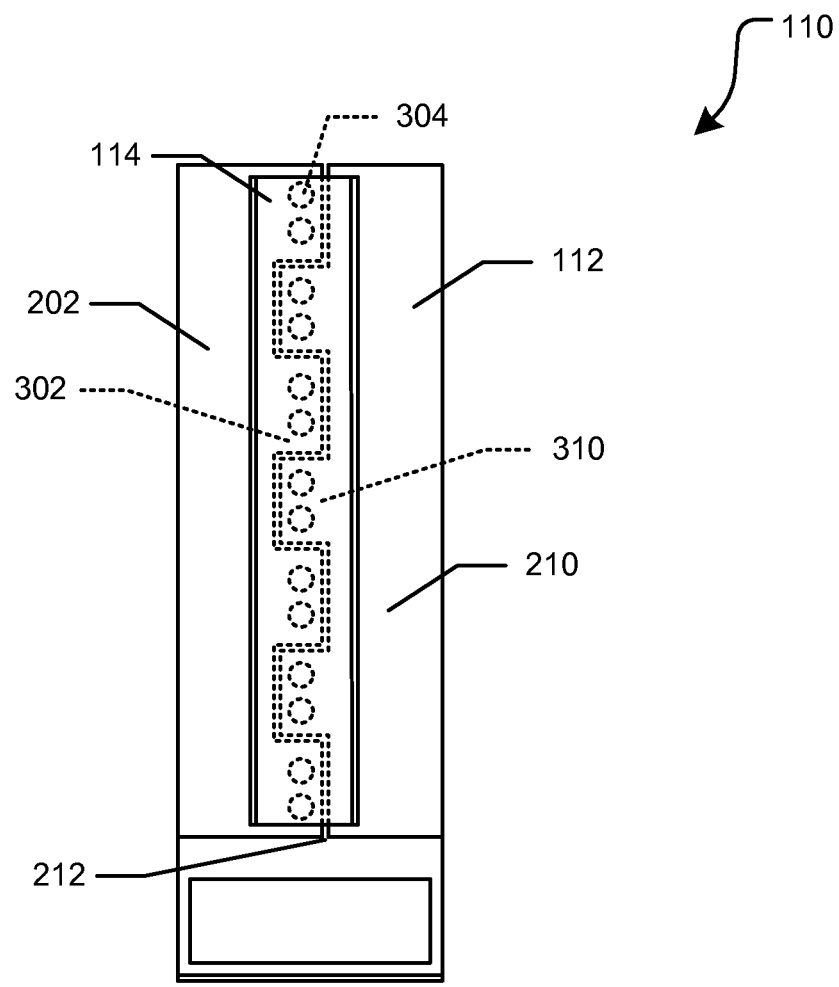
FIG. 3 is a top view of the assembly.

FIG. 3 is a top view of the assembly 110. The enclosure 112 includes the first top portion 202 having multiple tabs 302, attachment points 304, and the second top portion 210 having multiple tabs 310. The tabs 302 and 310 interjoin as a result of the tabs of the first top portion 202 extending from the first top portion at alternate locations than the tabs of second top portion 210 extending from the second top portion. Thus, the seam 212 alternates back and forth along the top of the enclosure 112.

Each of the multiple tabs 302 and 304 include the attachment points 304 to connect the guide rail 114 with the first top portion 202 and the second top portion 210. The guide rail 114 holds the enclosure 112 together by attaching to attachment points 304 of the tabs 302 of the first top portion 202 and the tabs 310 of the second top portion 210. The attachment of the guide rail 114 to the tabs 302 and 310 can give the enclosure 112 substantially the same structurally integrity as overlapping the portions of the enclosure, but does not cause a reduction in space for the servers 120 within the enclosure 112. Thus, the assembly 110 can provide alignment and support to the servers 120 while providing space within the enclosure 112 to enable multiple servers to be inserted within the enclosure. In another embodiment, the assembly 110 can be a full height server or a half height server including the enclosure 112, a guide rail 114, a plate 116, and rails 118 as disclosure herein.

Although only a few exemplary embodiments have been described in detail in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An assembly comprising:
   an enclosure having first and second top portions, first and second side portions, and a bottom portion, wherein the enclosure is a single piece of material such that the first top portion, the first side portion, the bottom portion, the second side portion, and the second top portion are continuous portions of the single piece of material, wherein both of the first and second top portions include tabs that alternate between being extended from the first top portion and being extended from the second top portion to join the first and second top portions together with a single alternating seam, and the tabs of the first and second top portions each include attachment points; and
   a guide rail attached to the first and second top portions of the enclosure, the guide rail to join the first and second top portions together, and to align the assembly within a server rack chassis, wherein the guide rail connects to the first and second top portions via the attachments points of the first and second top portions, and the guide rail covers the single alternating seam.

2. The assembly of claim 1 further comprising:
   a plate mounted within the enclosure in between the first and second side portions, the plate to support the first and second side portions.

3. The assembly of claim 1 further comprising:
   a plurality of rails mounted on inside of the first and second side portions of the enclosure, wherein one or more of the plurality of rails align and support a quarter height server within the assembly.

4. The assembly of claim 1 wherein the server rack chassis is designed to receive full height and half height servers.

5. The assembly of claim 1 wherein the single piece of material is bent at an intersection of the first top portion and the first side portion, an intersection of the first side portion and the bottom portion, an intersection of the bottom portion and the second side portion, and an intersection of the second side portion and the second top portion.

6. An assembly comprising:
an enclosure having first and second top portions, first and second side portions, and a bottom portion, wherein the enclosure is a single piece of material such that the first top portion, the first side portion, the bottom portion, the second side portion, and the second top portion are continuous portions of the single piece of material, wherein the single piece of material is bent at an intersection of the first top portion and the first side portion, an intersection of the first side portion and the bottom portion, an intersection of the bottom portion and the second side portion, and an intersection of the second side portion and the second top portion, wherein both of the first and second top portions include tabs that alternate between being extended from the first top portion and from the second top portion to join the first and second top portions together with a single alternating seam, and the tabs of the first and second top portions each include attachment points;
a guide rail attached to the first and second top portions of the enclosure, the guide rail to join the first and second top portions together, and to align the assembly within a server rack chassis, wherein the guide rail connects to the first and second top portions via the attachments points of the first and second top portions, and the guide rail covers the single alternating seam; and
a plate mounted within the enclosure in between the first and second side portions, the plate to support the first and second side portions.

7. The assembly of claim 6 further comprising:
a plurality of rails mounted on inside of the first and second side portions of the enclosure, wherein one or more of the plurality of rails align and support a quarter height server within the assembly.

8. The assembly of claim 7 wherein a height the quarter height server is a quarter of a height of a bay of the server rack chassis.

9. The assembly of claim 6 wherein the server rack chassis is designed to receive full height and half height servers.

10. An assembly comprising:
an enclosure having first and second top portions, first and second side portions, and a bottom portion, wherein the enclosure is a single piece of material such that the first top portion, the first side portion, the bottom portion, the second side portion, and the second top portion are continuous portions of the single piece of material, wherein each of the first and second top portions, the first and second side portions, and the bottom portion has a thickness equal to a thickness of the single piece of the material, and wherein the enclosure is configured to receive four individual quarter height servers, wherein both of the first and second top portions include tabs that alternate between being extended from the first top portion and from the second top portion to join the first and second top portions together with a single alternating seam, and the tabs of the first and second top portions each include attachment points; and
a guide rail attached to the first and second top portions of the enclosure, the guide rail to join the first and second top portions together, and to align the assembly within a server rack chassis, wherein the guide rail connects to the first and second top portions via the attachments points of the first and second top portions, and the guide rail covers the single alternating seam.

11. The assembly of claim 10 further comprising:
a plate mounted within the enclosure in between the first and second side portions, the plate to support the first and second side portions.

12. The assembly of claim 10 further comprising:
a plurality of rails mounted on inside of the first and second side portions of the enclosure, wherein one or more of the plurality of rails align and support one of the quarter height servers within the assembly.

13. The assembly of claim 10 wherein the server rack chassis is designed to receive full height and half height servers.

14. The assembly of claim 10 wherein the single piece of material is bent at an intersection of the first top portion and the first side portion, an intersection of the first side portion and the bottom portion, an intersection of the bottom portion and the second side portion, and an intersection of the second side portion and the second top portion.

* * * * *